(12) United States Patent
Park

(10) Patent No.: US 10,410,968 B2
(45) Date of Patent: Sep. 10, 2019

(54) SEMICONDUCTOR PACKAGE AND METHOD OF MANUFACTURING THE SAME

(71) Applicant: NEPES CO., LTD., Eumseong-gun, Chungcheongbuk-do (KR)

(72) Inventor: Yunmook Park, Cheongju-si (KR)

(73) Assignee: NEPES CO., LTD. (KR)

( * ) Notice: Subject to any disclaimer, the term of this patent is extended or adjusted under 35 U.S.C. 154(b) by 0 days.

(21) Appl. No.: 15/353,730

(22) Filed: Nov. 16, 2016

(65) Prior Publication Data

US 2017/0141043 A1 May 18, 2017

Related U.S. Application Data

(60) Provisional application No. 62/264,847, filed on Dec. 8, 2015, provisional application No. 62/256,686, filed on Nov. 17, 2015.

(51) Int. Cl.
*H01L 23/538* (2006.01)
*H01L 25/065* (2006.01)
(Continued)

(52) U.S. Cl.
CPC .... *H01L 23/5389* (2013.01); *H01L 21/31133* (2013.01); *H01L 21/565* (2013.01); *H01L 21/76895* (2013.01); *H01L 23/3128* (2013.01); *H01L 23/5385* (2013.01); *H01L 23/5386* (2013.01); *H01L 24/19* (2013.01); *H01L 24/20* (2013.01); *H01L 25/0657* (2013.01); *H01L 21/568* (2013.01); *H01L 23/5384* (2013.01); (Continued)

(58) Field of Classification Search
CPC .......... H01L 23/5389; H01L 23/5384
See application file for complete search history.

(56) References Cited

U.S. PATENT DOCUMENTS 8,169,072 B2 * 5/2012 Uchiyama ............. H01L 21/486
257/700
2009/0127686 A1 * 5/2009 Yang ....................... H01L 24/82
257/686
(Continued)

FOREIGN PATENT DOCUMENTS

JP  2015185575 A  10/2015
KR  101398811 B1  5/2014
(Continued)

*Primary Examiner* — Dale E Page
*Assistant Examiner* — Wilner Jean Baptiste
(74) *Attorney, Agent, or Firm* — Renaissance IP Law Group LLP

(57) ABSTRACT

Disclosed are a semiconductor package including a through via and a method of manufacturing the same. The semiconductor package includes a frame having an accommodation part and configured to transmit an electrical signal between upper and lower portions thereof through a through via provided around the accommodation part, one or more semiconductor chips accommodated in the accommodation part, a wiring part provided below the frame and the semiconductor chips and configured to connect the through via to the semiconductor chips, an encapsulant molded to integrate the frame and the semiconductor chips, and a conductive ball or a conductive post connected to an upper portion of the through via.

22 Claims, 9 Drawing Sheets

(51) Int. Cl.
  *H01L 21/311*    (2006.01)
  *H01L 21/56*     (2006.01)
  *H01L 21/768*    (2006.01)
  *H01L 23/31*     (2006.01)
  *H01L 23/00*     (2006.01)
  *H01L 25/10*     (2006.01)

(52) U.S. Cl.
  CPC .. *H01L 25/105* (2013.01); *H01L 2224/04105* (2013.01); *H01L 2224/12105* (2013.01); *H01L 2224/16235* (2013.01); *H01L 2224/24137* (2013.01); *H01L 2224/24195* (2013.01); *H01L 2225/06517* (2013.01); *H01L 2225/06548* (2013.01); *H01L 2225/1035* (2013.01); *H01L 2225/1041* (2013.01); *H01L 2225/1058* (2013.01); *H01L 2924/1815* (2013.01); *H01L 2924/19105* (2013.01); *H01L 2924/3025* (2013.01); *H01L 2924/3511* (2013.01)

(56) References Cited

U.S. PATENT DOCUMENTS

| | | | |
|---|---|---|---|
| 2012/0021565 A1* | 1/2012 | Gong | H01L 21/6835 438/121 |
| 2013/0234308 A1* | 9/2013 | Yamada | H01L 21/78 257/676 |
| 2013/0320518 A1 | 12/2013 | Chun | |
| 2015/0271929 A1 | 9/2015 | Noda et al. | |
| 2016/0148873 A1* | 5/2016 | Chiang | H01L 23/15 257/774 |

FOREIGN PATENT DOCUMENTS

| | | |
|---|---|---|
| KR | 20140126137 A | 10/2014 |
| KR | 20150089349 A | 8/2015 |

* cited by examiner

SEMICONDUCTOR PACKAGE AND METHOD OF MANUFACTURING THE SAME

CLAIM FOR PRIORITY

This application claims priority to U.S. Provisional Application No. 62/256,686 filed on Nov. 17, 2015 and U.S. Provisional Application No. 62/264,847 filed on Dec. 8, 2015, the entire contents of which are hereby incorporated by reference.

BACKGROUND

1. Technical Field

Example embodiments of the present invention relate to a semiconductor package and a method of manufacturing the same, and more particularly, to a semiconductor package including a through via, and a method of manufacturing the same.

2. Related Art

Recently, in semiconductor devices, with reduction of chip sizes and increase of the number of input-and-output terminals due to miniaturization process techniques and diversification of functions, pitches of electrode pads are gradually reduced, convergence of various functions is accelerated, and thus a system-level packaging technique in which various devices are integrated in a single package has emerged. In addition, the system-level packaging technique is being changed to a three-dimensional (3D) stacking technique in which a short signal distance can be maintained in order to minimize noise between operations and improve a signaling rate.

Meanwhile, in addition to such a demand for technical improvement, in order to control product costs, increase productivity, and reduce manufacturing costs, a semiconductor package formed by stacking a plurality of semiconductor chips is being introduced. For example, a multi-chip package (MCP) in which a plurality of semiconductor chips are stacked in a single semiconductor package and a system in package (SiP) in which different types of stacked chips operate as a single system are being implemented.

The SiP, which is a package for modularizing high density integrated circuits (ICs) such as semiconductor dies, is applied to portable terminals in which it is difficult to secure a mounting space, but is being variously applied to other products in recent years.

In this way, recently, a semiconductor package has been gradually miniaturizing, and a thickness thereof has also been decreasing.

However, in a package-on-package (PoP) in the related art, there is a limit in slimming a semiconductor package, and it is difficult to satisfy a fine pitch due to miniaturization.

SUMMARY

Accordingly, example embodiments of the present invention are provided to substantially obviate one or more problems due to limitations and disadvantages of the related art.

Example embodiments of the present invention provide a semiconductor package capable of manufacturing a slimmed package and a fine pitch, and a method of manufacturing the same.

In some example embodiments, a semiconductor package includes a frame having an accommodation part and configured to transmit an electrical signal between upper and lower portions thereof through a through via provided around the accommodation part, one or more semiconductor chips accommodated in the accommodation part, a wiring part provided below the frame and the semiconductor chips and configured to connect the through via to the semiconductor chips, an encapsulant molded to integrate the frame and the semiconductor chips, and a conductive ball connected to an upper portion of the through via, wherein the frame is provided as a printed circuit board (PCB) having a core layer disposed at a center thereof and a protective layer stacked on an upper surface of the core layer, the through via includes a penetrating part with which a via-hole passing through the frame is filled and a connection extending part configured to extend along the upper surface of the core layer from an upper portion of the penetrating part to an outside of the penetrating part, and the protective layer has an opening formed to expose the connection extending part.

The accommodation part may be formed at the center of the frame, the via-hole may be provided in a plurality and the plurality of via-holes may be provided around the accommodation part, and the conductive ball may be connected to the connection extending part.

The connection extending part may extend a cross sectional area of the penetrating part in a width direction of the frame.

The frame may be provided as a PCB in which an upper protective layer and a lower protective layer may be stacked on the upper surface of the core layer and a lower surface of the core layer, respectively, and the connection extending part may include an upper connection extending part which extends along the upper surface of the core layer and a lower connection extending part which extends along the lower surface of the core layer, wherein the upper protective layer may have an opening formed to expose the upper connection extending part and the lower protective layer may have an opening formed to expose the lower connection extending part.

The opening may be provided to have an area greater than that of the connection extending part so as to be accommodated in the connection extending part, and side surfaces of the connection extending part may be exposed by the opening.

The encapsulant may be formed with a recessed area by recessing the vicinity of the conductive ball, and side surfaces of the conductive ball may be exposed by the recessed area.

The recessed area may be formed to be tapered downward, and an inclined surface may be provided on an inside surface of the recessed area.

The wiring part may include a first insulating layer stacked on the frame and one surface of the semiconductor chip so as to expose a signal pad of the semiconductor chip and one surface of the through via, a wiring layer provided on the first insulating layer and configured to connect the signal pad of the semiconductor chip to one surface of the through via, and a second insulating layer configured to cover and insulate the wiring layer.

Also, the semiconductor package may further include an external connection terminal provided below the wiring part to be electrically connected to the wiring layer.

Also, the conductive ball may include a solder ball.

Also, the conductive ball may have a flat upper surface, and an upper surface of the encapsulant and the upper surface of the conductive ball may be coplanar.

Also, the frame may be provided to have a height the same as or higher than a height of the semiconductor chip.

In other example embodiments, a method of manufacturing a semiconductor package includes providing a frame having a through via formed therein, attaching a conductive ball to one side of the through via, disposing the frame on a first carrier so that the conductive ball is disposed thereon, disposing the semiconductor chip to be accommodated in the accommodation part of the frame, disposing an active surface of the semiconductor chip to face downward, sealing the frame, the semiconductor chip, and the conductive ball with an encapsulant to be integrated into a single structure, removing the first carrier, disposing one surface of the encapsulant on a second carrier, forming a wiring layer on a surface on which the first carrier is removed, removing the second carrier, and exposing the conductive ball by grinding a surface on which the second carrier is removed.

Also, a recessed area may be formed to expose an outside surface of the conductive ball by etching the encapsulant which surrounds the exposed conductive ball.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Figure 1:
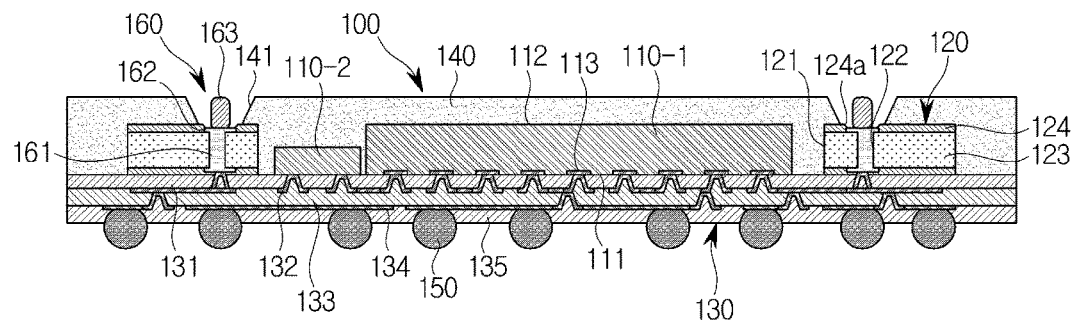
FIG. 1 is a cross-sectional view illustrating a semiconductor package according to a first embodiment of the present invention.

Hereinafter, example embodiments of the present invention will be described in detail with reference to the accompanying drawings. The example embodiments described below are only examples to fully convey the scope of the present invention more clearly to those skilled in the art, and the present invention is not limited thereto. The present invention may be embodied in another example embodiment. Parts irrelevant to description are omitted in the drawings in order to clearly explain the present invention, and widths, lengths, and thicknesses of components in the drawings may be exaggerated for convenience of explanation. Like reference numerals denote like elements throughout this specification. In addition, as used herein, the term "and/or" includes any and all combinations of one or more of the associated listed items.

FIG. 1 is a cross-sectional view illustrating a semiconductor package 100 according to a first embodiment of the present invention.

The semiconductor package 100 according to the first embodiment of the present invention may include a frame 120 including through vias 160, one or more semiconductor chips 110 (110-1 and 110-2) accommodated in an accommodation part 121 of the frame 120, a wiring part 130 electrically connected to the semiconductor chips 110 and the through vias 160, an encapsulant 140 which is molded to integrate the frame 120 and the semiconductor chips 110, and external connection terminals 150 which are electrically connected to the wiring part 130 and connect the semiconductor package 100 to external circuits (not illustrated).

The semiconductor chips 110 may include a first semiconductor chip 110-1 and a second semiconductor chip 110-2. The first semiconductor chip 110-1 may be an integrated circuit (IC) (or a die), and the second semiconductor chip 110-2 may be an active element or a passive element. Alternatively, the semiconductor package 100 according to the first embodiment of the present invention may include only a single semiconductor chip unlike the drawing.

Alternatively, the first semiconductor chip 110-1 and the second semiconductor chip 110-2 may be memory chips or logic chips. For example, the memory chip may include a dynamic random access memory (DRAM), a static random access memory (SRAM), a flash memory, a phase-change random access memory (PRAM), a resistive random access memory (ReRAM), a ferroelectric random access memory (FeRAM), a magnetoresistive random access memory (MRAM), or the like. For example, the logic chip may be a controller which controls memory chips.

The first semiconductor chip 110-1 and the second semiconductor chip 110-2 may be the same type of chips or different types of chips. For example, the first semiconductor chip 110-1 and the second semiconductor chip 110-2 may be provided as different types of chips, and may be provided in a form of a system in package (SiP) in which chips are electrically connected to each other and operate as a single system.

The first semiconductor chip 110-1 may include an active surface 111 including an active area in which circuits are formed. Also, a surface opposite the active surface 111 may be an inactive surface 112. Signal pads 113 for exchanging signals with the outside may be formed on the active surface 111. The signal pads 113 may be integrated with the first semiconductor chip 110-1.

The signal pads 113 are electrically connected to the wiring part 130. The signal pads 113 and the wiring part 130 may be connected by bumps or conductive adhesive materials. For example, the connection may be a solder joint bonding using a molten material of a metal (such as lead (Pb) and tin (Sn)).

The first semiconductor chip 110-1 and the second semiconductor chip 110-2 may be provided in the accommodation part 121 formed at the center of the frame 120. Also, side surfaces of the semiconductor chips 110 may be spaced apart from the frame 120. Also, a gap between the semiconductor chips 110 and the frame 120 may be filled with the encapsulant 140.

Further, the active surface 111 of the first semiconductor chip 110-1 may be disposed to face downward, and thus may face the wiring part 130. In this case, the active surface 111 (i.e., a lower surface) of the first semiconductor chip 110-1 and a lower surface of the frame 120 may be coplanar.

Further, heights of the first semiconductor chip 110-1 and the second semiconductor chip 110-2 may be the same as or lower than a height of the frame 120. In the drawing, the height of the first semiconductor chip 110-1 is illustrated as the same as the height of the frame 120, and the height of the second semiconductor chip 110-2 is illustrated as being lower than the height of the frame 120. Since the semiconductor chips 110 do not protrude from an upper portion of the frame 120, the semiconductor chips 110 may be safe from external impact.

The frame 120 may include the accommodation part 121 which accommodates the semiconductor chips 110 and is formed at the center of the frame 120, and a plurality of through-holes, that is, a plurality of via-holes 122, which are formed around the accommodation part 121. The accommodation part 121 may be provided as an open area at the center of the frame 120 or may be formed to pass through the frame 120.

For example, in a top view, the frame 120 may have a rectangular shape that is hollowed by an area corresponding to the accommodation part 121, or a pair of rectangular shapes that are disposed to be spaced apart by the area corresponding to the accommodation part 121. Further, the frame 120 may be provided to have another shape instead of the above shapes.

Also, the via-holes 122 may be formed to pass through the frame 120 and provided in a plurality along edges of the semiconductor chips 110. Also, the through vias 160 which transfer electrical signals in a vertical direction is provided in the via-holes 122. The through vias 160 will be described below in detail.

The frame 120 may be a via frame. The via frame may be provided as a substrate through which the through vias 160 are formed. For example, the frame 120 may be a printed circuit board (PCB) on which circuits are formed. Alternatively, the frame 120 may be an insulation frame. The insulation frame may include an insulating material. For example, the insulating material may include silicon, glass, a ceramic, plastic, or a polymer.

In the drawing, a PCB is illustrated as an example of the frame 120. The PCB may include a core layer 123 disposed at the center thereof, and protective layers 124 disposed above and below the core layer 123. For example, the core layer 123 may be an interposer, and the protective layers 124 may be passivation layers which cover both surfaces of the interposer.

Further, the frame 120 may serve as a supporting member which supports the semiconductor package 100. The frame 120 may serve as a framework which supports and protects semiconductor chips from external moisture or impact.

Further, when the frame 120 is made of a metal, warpage caused by heat generated in a manufacturing process may be minimized, and it may be advantageous for heat dissipation and noise shielding.

The through via 160 may transmit an electrical signal in a vertical direction of the semiconductor package 100. For example, one side of the through via 160 is connected to the wiring part 130 provided at one surface of the frame 120 and may be electrically connected to the first semiconductor chip 110-1 and/or the second semiconductor chip 110-2 through wiring layers 132 and 134, and another side of the through via 160 may be electrically connected to an external circuit or another semiconductor package (not illustrated) which is stacked on the semiconductor package 100.

Further, one side of the through via 160 may be electrically connected to an external connection terminal 150.

Further, the through via 160 may be disposed through the via-hole 122 provided in the frame 120 in a vertical direction. The through via 160 may be a conductive material with which the via-hole 122 is filled. For example, the through via 160 may be provided to have a cylindrical shape.

Alternatively, the through via 160 may be a metal layer with which an inner circumferential surface of the via-hole 122 is coated. Alternatively, the through via 160 may have a solder ball shape or the like and pass through the via-hole 122, or may be a solder resist ink with which the via-hole 122 is filled.

Meanwhile, a method of forming the through via 160 includes electroless plating, electrolytic plating, sputtering, printing, or the like.

Meanwhile, although not illustrated in the drawing, the frame 120 may include a plurality of signal leads (not illustrated). The signal leads may be attached to one surface of the frame 120.

Further, the through via 160 may include a penetrating part 161 accommodated in the via-hole 122, and a connection extending part 162 provided at at least one of upper and lower portions of the penetrating part 161. The connection extending part 162 may be provided to have an area greater than an area of the penetrating part 161. Therefore, the connection extending part 162 may expand a connection area of the through via 160, and thus connection reliability thereof can be improved.

Referring to the drawing, the connection extending part 162 may be integrated with the penetrating part 161. Alternatively, the connection extending part 162 may have a shape of a pad attached to one end of the penetrating part 161 unlike the drawing.

Further, conductive posts 163 electrically connected to the penetrating part 161 or an upper portion of the connection extending part 162 may be attached to one surface of the through via 160. The conductive post 163 may be electrically connected to an external terminal (not illustrated), which is provided on the through via 160 and provided on a lower portion of a package that may be stacked on the semiconductor package 100.

The conductive post 163 may be made of a conductive material including a metal and may include, for example, copper (Cu). Further, the conductive post 163 may be provided to have a cylindrical shape. Also, an upper surface of the conductive post 163 may not be at a higher level than an upper surface of the encapsulant 140 to be described below. For example, the upper surface of the conductive post 163 and the upper surface of the encapsulant 140 may be coplanar.

The wiring part 130 may electrically connect the semiconductor chips 110 to the through vias 160. The wiring part 130 may be formed, for example, through a process of rearranging metal wires.

The wiring part 130 may include wiring layers 132 and 134 and insulating layers 131, 133, and 135. The wiring layers 132 and 134 may include a conductive material, for example, a metal. For example, the wiring layers 132 and 134 may include copper, aluminum, or an alloy thereof. Also, the insulating layers 131, 133, and 135 may include an organic or inorganic insulating material. For example, the insulating layers 131, 133, and 135 may include an epoxy resin.

The insulating layers 131, 133, and 135 may be formed to have a three-layer structure, and the wiring layers 132 and 134 may be interposed between the insulating layers 131, 133, and 135. For example, the wiring part 130 may include the first and second wiring layers 132 and 134 which are provided to have a two-layer structure and electrically connected to each other, the first insulating layer 131 which insulates the semiconductor chips 110 and the frame 120 from one surface of the first wiring layer 132, the second insulating layer 133 which insulates another surface of the first wiring layer 132 from one surface of the second wiring layer 134, and the third insulating layer 135 which insulates another surface of the second wiring layer 134 from the outside.

Also, the first wiring layer 132 may be connected to the through via 160 and the semiconductor chips 110, and the second wiring layer 134 may be connected to the external connection terminals 150 to be described below.

The wiring part 130 may rewire the semiconductor chips 110 to form circuits. This process is also referred to as a build-up process. That is, the semiconductor chips 110 may be rewired by the wiring part 130, and thus the semiconductor package 100 may have a fan-out structure. Therefore, input-and-output terminals of the semiconductor chips 110 may be miniaturized, and the number of the input-and-output terminals may also be increased.

The encapsulant 140 may be molded to integrate the first and second semiconductor chips 110-1 and 110-2, the frame 120, and the wiring part 130. The encapsulant 140 may include an insulating material, for example, an epoxy mold compound (EMC) or an encapsulant.

The encapsulant 140 may be injected in a fluid state and then cured in a high-temperature environment. For example, the above process may include a process of heating and pressing the encapsulant 140, and in this case, a gas and the like in the encapsulant 140 may be removed by adding a vacuuming process. The frame 120 and the first and second semiconductor chips 110-1 and 110-2 are integrated into a single structure while the encapsulant 140 is cured.

Further, the encapsulant 140 may fill a gap between the accommodation part 121 of the frame 120 and the semiconductor chips 110 and a gap between the first semiconductor chip 110-1 and the second semiconductor chip 110-2. Further, the encapsulant 140 may be provided to cover upper portions of the frame 120 and the semiconductor chips 110. Further, the encapsulant 140 may be provided to surround edges of the frame 120. Therefore, the frame 120 and the semiconductor chips 110 may be surrounded with the encapsulant 140 and not exposed to the outside, and may be protected from external impact.

Further, since the encapsulant 140 seals upper and side surfaces of the frame 120 and the semiconductor chips 110, an amount of gas generated by the moisture absorption of the frame 120 in the manufacturing process may be minimized, and thus the process may be stabilized. Also, since the frame 120 is prevented from directly absorbing moisture, deformation due to the moisture absorption may be minimized.

In the semiconductor package 100 having a fan-out structure, the external connection terminals 150 are provided to have a connection area greater than active areas of the semiconductor chips 110. Here, the connection area of the external connection terminal 150 refers to an area formed when an outermost external connection terminal 150 is connected to the wiring layers 132 and 134 and the active area of the semiconductor chip 110 refers to an area formed when an outermost signal pad 113 is connected.

The external connection terminals 150 are connected to the wiring layers 132 and 134 to electrically connect the semiconductor package 100 to an external circuit or another semiconductor package (not illustrated). In the drawing, although a solder ball is illustrated as an example of the external connection terminal 150, the external connection terminal 150 may include a solder bump or the like. Further, surface processing such as organic coating, metal plating, or the like is performed on surfaces of the external connection terminals 150, and thus the surfaces may be prevented from being oxidized. For example, the organic coating may be organic solder preservation (OSP) coating, and the metal plating may be performed by gold (Au), nickel (Ni), lead (Pb), or silver (Ag) plating.

Since the semiconductor package 100 according to the first embodiment of the present invention includes the through vias 160 passing through the frame 120 in a vertical direction, the semiconductor package 100 may transmit electrical signals in the vertical direction. Specifically, external terminals (not illustrated) connected to upper portions of the through vias 160 may be electrically connected to the wiring part 130 connected to lower portions of the through vias 160, and the wiring part 130 may be connected to the semiconductor chips 110.

Further, the connection to the external terminals (not illustrated) can be facilitated through the conductive posts 163 connected to the upper portions of the through vias 160. Specifically, the encapsulant 140 may be formed with a recessed area 141 which exposes the conductive post 163. Further, the recessed area 141 may include a guide surface which guides the external terminal (not illustrated) to the conductive post 163. For example, the recessed area 141 may be formed to be tapered downward. For example, the recessed area 141 may have a part of a conical shape.

As described above, the conductive posts 163 are provided and the recessed area 141 is formed in the encapsulant 140, and thus, when another package (not illustrated) is stacked on the semiconductor package 100, external terminals (not illustrated) of the package may be easily aligned with the conductive posts 163 and connection reliability thereof can be improved.

Next, a process of manufacturing the semiconductor package 100 according to the first embodiment will be described with reference to the drawings. FIGS. 2 to 11 are cross-sectional views illustrating the process of manufacturing the semiconductor package 100 according to the first embodiment of the present invention.

Figure 2:
FIGS. 2 to 11 are cross-sectional views illustrating a process of manufacturing the semiconductor package according to the first embodiment of the present invention.

FIG. 2 illustrates a process of providing a frame 120 in which a through via 160 is formed.

Referring to FIG. 2, the frame 120 may be provided as a PCB. That is, the frame 120 may include a core layer 123 positioned at a center thereof, and protective layers 124 stacked above and below the core layer 123.

Further, the frame 120 may be in a state in which the through via 160 is provided. That is, a via-hole 122 formed in the frame 120 may be filled with the through via 160.

Also, the through via 160 may include a penetrating part 161 passing through the core layer 123 in a vertical direction, and a connection extending part 162 which expands connection areas of the penetrating part 161 along upper and lower surfaces of the core layer 123.

In the drawing, the connection extending parts 162 are illustrated as being formed on both of the upper and lower surfaces of the core layer 123. However, the connection extending parts 162 may be formed on only one surface thereof or may not be formed on any surface, unlike the drawing.

Also, the through via 160 and the connection extending part 162 may be formed in a single process. For example, the connection extending part 162 may be a signal lead. Alternatively, the connection extending part 162 may be formed to be attached to the through via 160 after the through via 160 is formed. For example, the connection extending part 162 may be a signal pad.

Also, the protective layer 124 may be provided to cover the connection extending parts 162. In this case, the protective layer 124 may include an insulator.

Figure 3:
Figure 4:

FIG. 3 illustrates a process of exposing the through via 160 by forming openings 124*a* and 124*b* in the protective layer 124, and FIG. 4 illustrates a process of attaching a conductive post 163.

Referring to FIG. 3, the through via 160 is exposed by the openings 124*a* and 124*b* formed in both surfaces of the frame 120. For example, the connection extending part 162 of the through via 160 may be exposed by the opening 124*a* or 124*b* formed in one surface of the frame 120.

In the drawing, an area of the opening 124*a* or 124*b* formed in one surface of the frame 120 is illustrated as being smaller than an area of the connection extending part 162. Also, the core layer 123 may be formed not to be exposed by the openings 124*a* and 124*b*.

Alternatively, unlike the drawing, the areas of the openings 124*a* and 124*b* may be greater than the area of the connection extending part 162. In this case, since side surfaces of the connection extending part 162 are exposed, the connection reliability of the conductive post 163 can be improved. That is, even when the conductive post 163 is misaligned, the probability that the conductive post 163 and the connection extending part 162 may be electrically connected increases.

Referring to FIG. 4, the conductive post 163 may be, for example, a copper (Cu) post. Also, a cross sectional area of a lower portion of the conductive post 163 may be smaller than a cross sectional area of the opening 124*a* formed in one surface of the frame 120. That is, since the conductive post 163 having a relatively small area is connected to the connection extending part 162 having a relatively large area exposed by the opening 124*a*, an alignment process of the conductive post 163 can be facilitated and the connection reliability thereof can be improved. Also, as described above, when the side surfaces of the connection extending part 162 are exposed because the area of the opening 124*a* is greater than the area of the connection extending part 162, the connection reliability can be further improved in the process of attaching the conductive post 163.

Referring to the drawing, the opening 124*a* formed in an upper portion of the through via 160 is an area in which the conductive post 163 is connected thereto, and the opening 124*b* formed in a lower portion of the through via 160 is an area in which a first wiring layer 132 to be described below is connected thereto.

Figure 5:
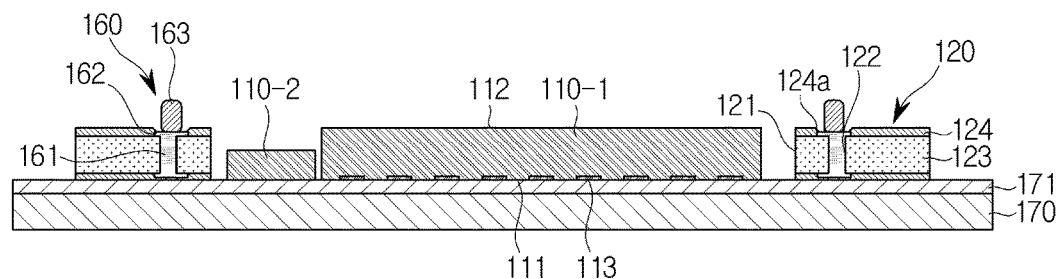

FIG. 5 illustrates an attaching process on a first carrier 170.

Referring to FIG. 5, the frame 120 is disposed on the first carrier 170, and a first semiconductor chip 110-1 and a second semiconductor chip 110-2 are disposed in an accommodation part 121 formed at a center of the frame 120. The frame 120 and the first and second semiconductor chips 110-1 and 110-2 may be fixed to the first carrier 170 by a bonding layer 171.

In this case, the frame 120 is disposed on the first carrier 170 so that the conductive post 163 faces upward, and the first semiconductor chip 110-1 is disposed on the first carrier 170 so that an active surface 111 faces downward.

Also, the first and second semiconductor chips 110-1 and 110-2 may be disposed to be separated from an inside surface of the accommodation part 121 of the frame 120, and the two semiconductor chips 110-1 and 110-2 may be disposed to be separated from each other.

Meanwhile, although the active surface 111 of the first semiconductor chip 110-1 is illustrated as being directly attached to the bonding layer 171 in FIG. 5, a signal transmission part (not illustrated) electrically connected to signal pads 113 may be bonded to the bonding layer 171, and thus the first semiconductor chip 110-1 may be disposed to be separated from the bonding layer 171 unlike the drawing.

Meanwhile, although a single semiconductor package 100 is illustrated as being manufactured on the first carrier 170 in the drawing, a plurality of frames 120 and semiconductor chips 110 may be attached to the first carrier 170 at predetermined intervals, and thus a plurality of semiconductor packages 100 may be simultaneously manufactured in one process unlike the drawing.

The first carrier 170, which is for supporting the frame 120 and the semiconductor chips 110, may be made of a material having high rigidity and low thermal strain. The first carrier 170 may be made of a rigid type material, and a material such as a molded article, a polyimide tape, or the like may be used as the first carrier 170.

A double-sided adhesive film may be used as the bonding layer 171, one surface of the bonding layer 171 may be fixedly attached to the first carrier 170, and the other surface thereof may be attached to the frame 120 and the like.

Figure 6:
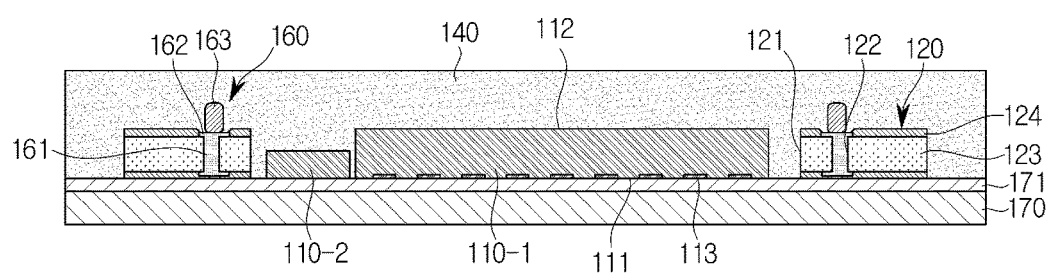

FIG. 6 illustrates a process of molding an encapsulant 140.

Referring to FIG. 6, the encapsulant 140 in a fluid state may be provided on the first carrier 170 by being injected between the first carrier 170 and an upper mold (not illustrated) and may be pressed and cured by the upper mold at high temperature.

The encapsulant 140 fills gaps between the frame 120 and the first and second semiconductor chips 110-1 and 110-2 by being injected into the mold, and is provided to cover upper portions of the frame 120 and the first and second semiconductor chips 110-1 and 110-2 and to surround both sides of the frame 120.

With the passage of time, the encapsulant 140 is cured, and in this process, the frame 120 and the first and second semiconductor chips 110-1 and 110-2 are integrated.

Although the encapsulant 140 in the fluid state is described as being injected as a method of molding the encapsulant 140, a different method of coating, printing, or the like may be used. Further, various techniques commonly used in the related art may be used as the method of molding the encapsulant 140.

Meanwhile, in the drawing, the encapsulant 140 is illustrated as being provided to have a height suitable to cover the conductive post 163. However, the encapsulant 140 may be formed to expose an end of the conductive post 163 unlike the drawing. That is, in order to expose the end of the conductive post 163 in the process of molding the encapsulant 140, a thickness of the encapsulant 140 may be adjusted. This is meaningful in that a process of etching the encapsulant 140 to expose the end of the conductive post 163 may be omitted in a subsequent process.

In order to adjust the thickness of the encapsulant 140, a masking member (not illustrated) may be brought into contact with an exposed portion of the conductive post 163. The masking member may be a film for preventing the upper mold (not illustrated) and the encapsulant 140 from adhering, and may be, for example, a release film. Further, the masking member includes a member which is separately inserted into a lower portion of the upper mold.

The masking member may have elasticity, thereby accommodating the exposed portion of the conductive post 163. Therefore, when the encapsulant 140 fills a gap between the first carrier 170 and the masking member, the exposed portion of the conductive post 163 may not be sealed by the encapsulant 140.

Figure 7:
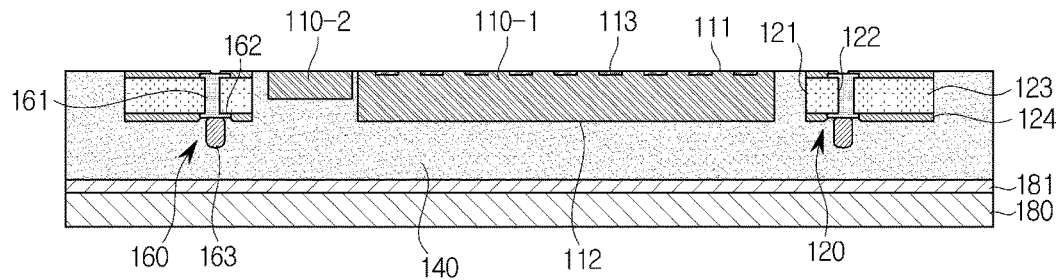
Figure 8:
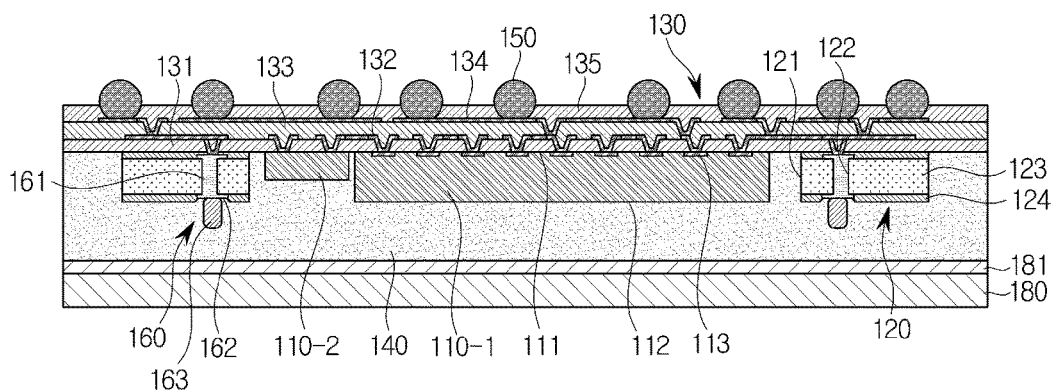

FIG. 7 illustrates an attaching process on a second carrier 180, and FIG. 8 illustrates a process of forming a wiring part 130 and external connection terminals 150.

Referring to FIG. 7, one surface of the cured encapsulant 140 is disposed on the second carrier 180. In this case, the encapsulant 140 is disposed to upwardly expose the active surfaces 111 of the first and second semiconductor chips 110-1 and 110-2 and one surface of the frame 120. Also, one end of the through via 160 positioned on an upper surface of the frame 120 is exposed.

The second carrier 180, which is for supporting the frame 120, the semiconductor chips 110, and the encapsulant 140, may be made of a material having a high rigidity and a low thermal strain. The second carrier 180 may be made of a rigid type material, and a material such as a molded article, a polyimide tape, or the like may be used as the second carrier 180.

A double-sided adhesive film may be used as a bonding layer 181, one surface of the bonding layer 181 may be fixedly attached to the second carrier 180, and the other surface thereof may be attached to the encapsulant 140.

Referring to FIG. 8, the wiring part 130 may be formed on one surface of each of the frame 120 and the first and second semiconductor chips 110-1 and 110-2. Also, the external connection terminals 150 may be attached to an upper portion of the wiring part 130.

Specifically, a first insulating layer 131 is stacked on one surface of each of the frame 120 and the first and second semiconductor chips 110-1 and 110-2 to expose portions of the through vias 160 and the signal pads 113 of the first semiconductor chip 110-1. A method of etching the first insulating layer 131 by laser processing, chemical processing, or the like may be used as a method of exposing a portion of the first insulating layer 131.

Also, a first wiring layer 132 is formed on the first insulating layer 131. The first wiring layer 132 may be electrically connected to the signal pads 113 and the through vias 160 through the exposed portion of the first insulating layer 131 and may form a re-wiring layer. Also, the first wiring layer 132 may be formed using various methods such as deposition, plating, or the like. Also, the first wiring layer 132 may be stacked on the first insulating layer 131 in a state in which a pattern is pre-formed therein, or a pattern may be formed through a mask after the first wiring layer 132 is stacked on the first insulating layer 131.

Also, a second insulating layer 133 may be stacked on one surface of the first insulating layer 131 to expose a portion of the first wiring layer 132. Also, a second wiring layer 134 may be formed on the second insulating layer 133. The second wiring layer 134 may be formed to be connected to the first wiring layer 132 and may form a re-wiring layer. Also, a third insulating layer 135 may be stacked on one surface of the second insulating layer 133 to expose a portion of the second wiring layer 134. Also, the external connection terminals 150 may be attached to the exposed area of the third insulating layer 135 and electrically connected to the second wiring layer 134.

The description of the first insulating layer 131 may be applied to descriptions of the second and third insulating layers 133 and 135, and the description of the first wiring layer 132 may be applied to the description of the second wiring layer 134.

Further, although the wiring part 130 including the wiring layers 132 and 134 having a two-layer structure is illustrated in the drawing, the wiring part 130 may include a wiring layer having a one-layer structure unlike the drawing. In this case, an insulating layer having a two-layer structure may be provided.

The external connection terminals 150 are attached to one surface of the wiring part 130 and electrically connect the semiconductor package 100 to an external part. The external part may be an external circuit or another semiconductor package (not illustrated). Although a solder ball is illustrated as an example of the external connection terminal 150 in the drawing, the external connection terminal 150 may include a solder bump or the like.

Figure 9:
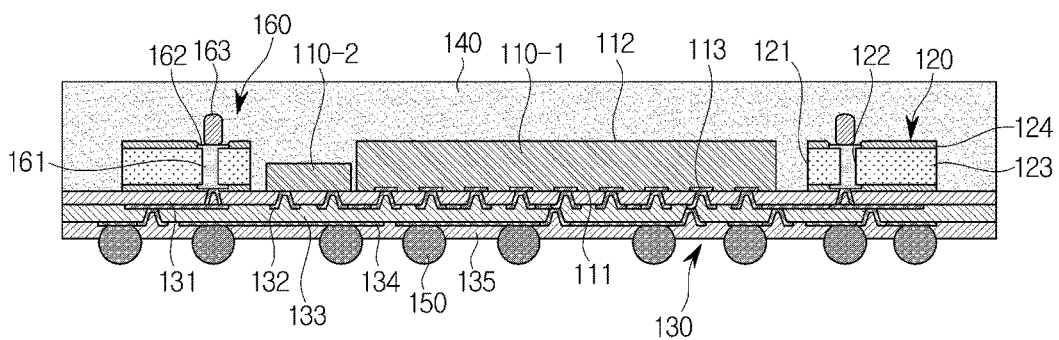
Figure 10:
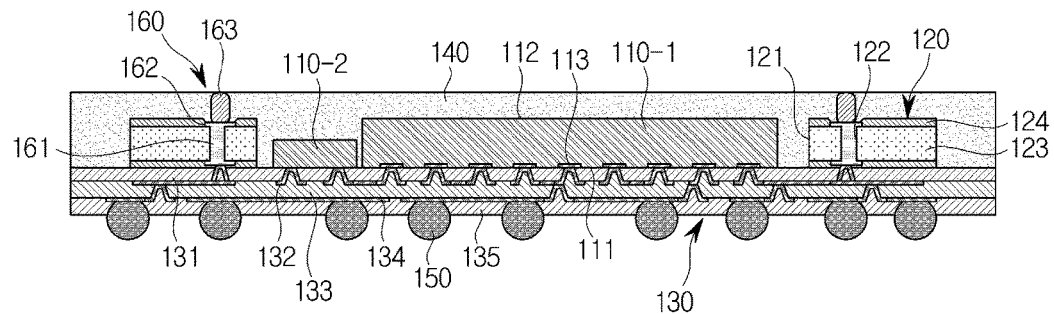
Figure 11:
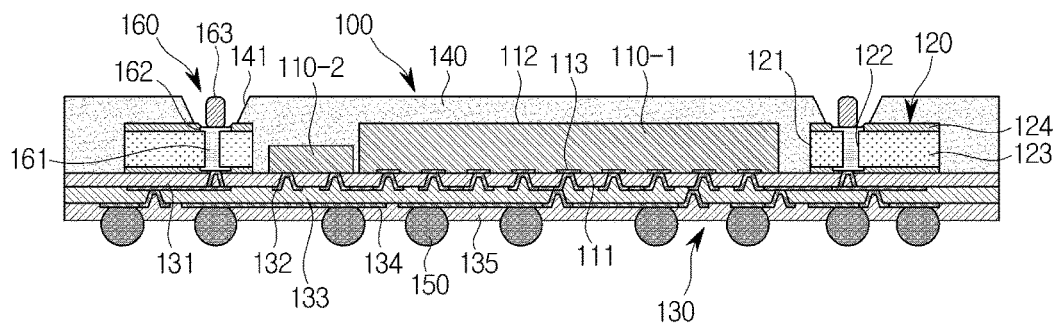

FIG. 9 illustrates a process of removing the second carrier 180, FIG. 10 illustrates a process of exposing the conductive posts 163 by grinding the encapsulant 140, and FIG. 11 illustrates a process of forming recessed areas 141 in the vicinity of the conductive post 163.

Referring to FIG. 9, the second carrier 180 which supports one surface of the encapsulant 140 may be removed. Also, intermediate products may be disposed so that the external connection terminals 150 face downward.

Meanwhile, although not illustrated in the drawing, the intermediate products may be fixed to another carrier (not illustrated) by a bonding layer. Further, the bonding layer or the carrier may accommodate the external connection terminals 150 to prevent the external connection terminals 150 from being damaged.

Referring to FIG. 10, the end of the conductive post 163 may be exposed by grinding one surface of the encapsulant 140. In this case, a portion of the end of the conductive post 163 may also be grinded.

Referring to FIG. 11, the recessed area 141 may be formed by etching the vicinity of the conductive post 163. The recessed area 141 may guide external terminals (not illustrated) connected to the conductive post 163 to be electrically connected to the conductive post 163. Further, as connection areas of the conductive post 163 and the external terminals (not illustrated) are increased, alignment errors can be allowed. That is, a degree of difficulty in the alignment process can be reduced.

Meanwhile, although the recessed areas 141 are illustrated as being etched to expose a portion of the frame 120 in the drawing, the recessed areas 141 may be etched so that the frame 120 is not exposed unlike the drawing.

Figure 12:
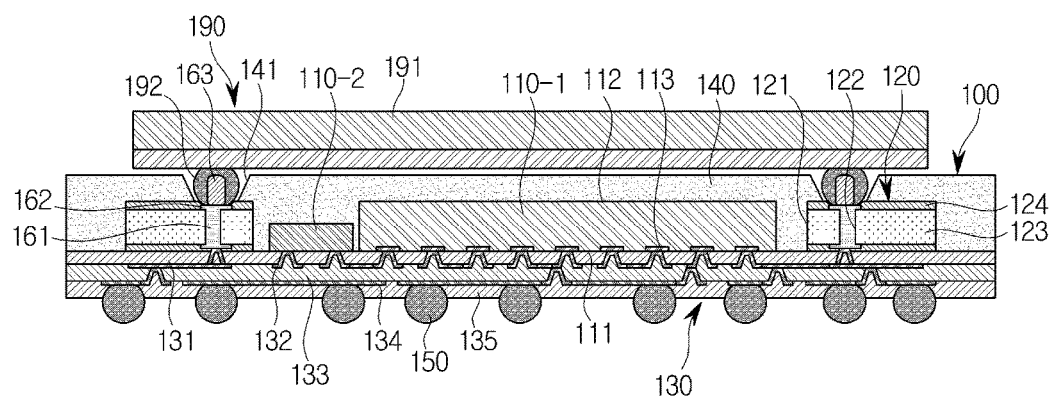
FIG. 12 is a cross-sectional view illustrating a package-on-package (PoP) according to the first embodiment of the present invention.

FIG. 12 is a cross-sectional view illustrating a package-on-package (PoP) according to the first embodiment of the present invention.

In the PoP according to the first embodiment of the present invention, another package 190 is stacked on and connected to the semiconductor package 100 illustrated in FIG. 11. The stacked package 190 may be a semiconductor chip, a semiconductor package, a circuit board, or the like.

The stacked package 190 may include a circuit part 191 and connection terminals 192. The connection terminals 192 are electrically connected to the circuit part 191.

The connection terminal 192 may be connected to the conductive post 163 of the semiconductor package 100. For example, the connection terminal 192 may be provided as a solder ball. Also, the connection terminal 192 and the conductive post 163 may be connected to each other so that an end of the through via 160 is not exposed to the outside.

Figure 13:
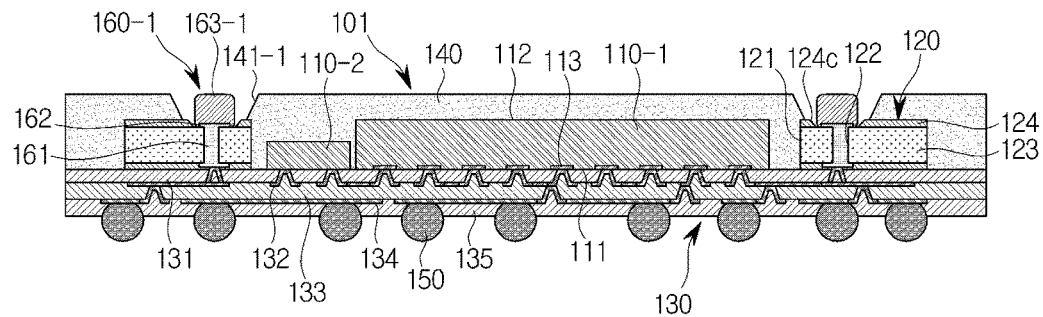
FIG. 13 is a cross-sectional view illustrating a semiconductor package according to a first modified embodiment of the first embodiment of the present invention.

FIG. 13 is a cross-sectional view illustrating a semiconductor package 101 according to a first modified embodiment of the first embodiment of the present invention.

In the semiconductor package 101 according to the first modified embodiment, a different type of conductive post 163-1 may be provided. Specifically, the conductive post 163-1 may be provided to have a cross sectional area greater than that of the connection extending part 162 of the through via 160. That is, in the semiconductor package 101 according to the first modified embodiment, since the conductive post 163-1 is provided to have the cross sectional area relatively greater than that of the through via 160, connection reliability thereof can be improved.

For example, the connection extending part 162 may be provided so that an entire area thereof is exposed. Specifically, an opening 124c formed in a protective layer 124 of the frame 120 may be formed to have a size suitable to accommodate the connection extending part 162 therein. Therefore, side surfaces of the connection extending part 162 may be exposed by the opening 124c.

Also, the conductive post 163-1 may be connected to the entire area of the connection extending part 162 exposed by the opening 124c. That is, the conductive post 163-1 may be connected to the side surfaces of the connection extending part 162 as well as an upper surface of the connection extending part 162.

Meanwhile, when the conductive post 163-1 is misaligned, the conductive post 163-1 may be connected to only one surface of the connection extending part 162. In this case, however, the connection reliability of the conductive post 163-1 can be maintained.

Figure 14:
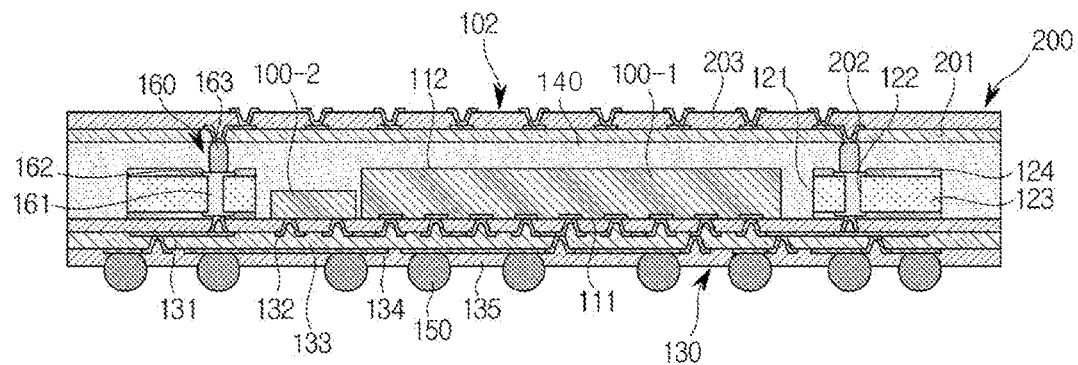
FIG. 14 is a cross-sectional view illustrating a semiconductor package according to a second modified embodiment of the first embodiment of the present invention.

FIG. 14 is a cross-sectional view illustrating a semiconductor package 102 according to a second modified embodiment of the first embodiment of the present invention.

In the semiconductor package 102 according to the second modified embodiment, an upper wiring part 200 may be stacked on an encapsulant 140. The upper wiring part 200 may include a first upper insulating layer 201, which is stacked on the encapsulant 140 and provided to expose an end of the conductive post 163, an upper wiring layer 202 electrically connected to the conductive post 163 and forming a pattern on the first upper insulating layer 201, and a second upper insulating layer 203, which is stacked on the first upper insulating layer 201 and provided to expose a portion of the upper wiring layer 202.

Further, in the semiconductor package 102 according to the second modified embodiment, the recessed areas 141 (see FIG. 11) may not be formed in the vicinity of the conductive post 163. That is, as illustrated in FIG. 10, the upper wiring part 200 may be formed after the end of the conductive post 163 is exposed by grinding one surface of the encapsulant 140.

Figure 15:
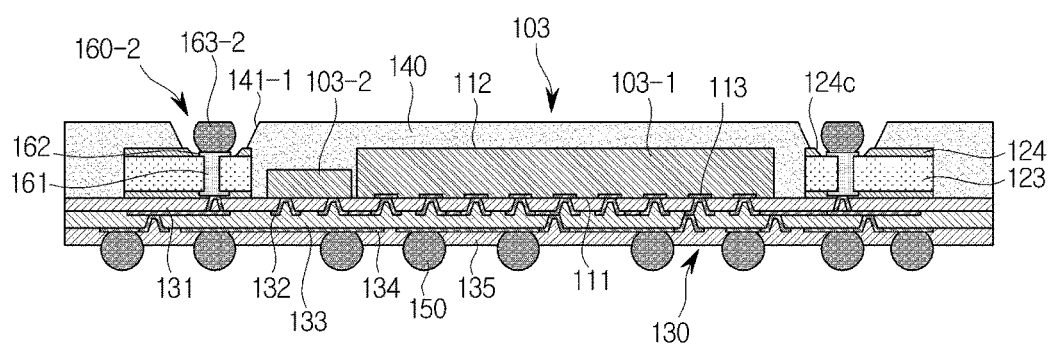
FIG. 15 is a cross-sectional view illustrating a semiconductor package according to a second embodiment of the present invention.

FIG. 15 is a cross-sectional view illustrating a semiconductor package 103 according to a second embodiment of the present invention.

In the semiconductor package 103 according to the second embodiment of the present invention, conductive posts 163-2 may be provided to have a ball shape. For example, the conductive post 163-2 may be a solder ball.

Since the conductive post 163-2 is provided to have a deformable ball shape, the conductive post 163-2 may be easily connected to the through via 160. When the conductive post 163-2 is provided as a solder ball, the shape thereof may be modified in a connection process, and a contact area with a through via 160 may be expanded in the process of modifying the shape.

Further, when the conductive post 163-2 is provided as a solder ball, the conductive posts 163-2 may be easily connected to external terminals (not illustrated). For example, when the external terminal (not illustrated) is also provided as a solder ball, it is possible to perform self-alignment in the process of connecting the external terminals (not illustrated) to the conductive posts 163-2. Further, due to the flexibility of a solder ball (the shape deformability of a solder ball), a step generated by warpage of the semiconductor package may be overcome.

Further, a connection extending part 162 of the through via 160 may be provided so that an entire area thereof is exposed. Specifically, an opening 124c formed in a protective layer 124 of a frame 120 may be formed to have a size suitable to accommodate the connection extending part 162 therein. Therefore, side surfaces of the connection extending part 162 may be exposed by the opening 124c.

In the drawing, the conductive posts 163-2 are illustrated as being connected to only an upper surface of the connection extending part 162. However, the conductive post 163-2 may be connected to the connection extending part 162 so as to accommodate the connection extending part 162 therein unlike the drawing. That is, the conductive post 163-2 may be connected to the side surfaces of the connection extending part 162 as well as the upper surface of the connection extending part 162. That is, despite alignment errors of the conductive posts 163-2, the connection reliability thereof can be improved.

Further, an upper portion of the conductive post 163-2 may be planarized in a process of grinding an encapsulant 140. As the upper portion of the conductive post 163-2 is planarized, a contact area with an external terminal (not illustrated) may be expanded. In this case, the upper surface of the conductive post 163-2 and an upper surface of the encapsulant 140 may be coplanar.

Next, a process of manufacturing the semiconductor package 103 according to the second embodiment will be described with reference to the drawings. FIGS. 16 to 25 are cross-sectional views illustrating the process of manufacturing the semiconductor package 103 according to the second embodiment of the present invention.

Figure 16:
FIGS. 16 to 25 are cross-sectional views illustrating a process of manufacturing the semiconductor package according to the second embodiment of the present invention.

FIG. 16 illustrates a process of providing a frame 120 in which a through via 160 is formed.

Referring to FIG. 16, the frame 120 may be provided as a PCB. That is, the frame 120 may include a core layer 123 positioned at a center thereof, and protective layers 124 stacked above and below the core layer 123.

Further, the frame 120 may be in a state in which the through via 160 is provided. That is, a via-hole 122 formed in the frame 120 may be filled with the through via 160.

Also, the through via 160 may include a penetrating part 161 passing through the core layer 123 in a vertical direction, and connection extending parts 162 which expand connection areas of the penetrating part 161 along upper and lower surfaces of the core layer 123. Although the connection extending parts 162 are illustrated as being formed on both the upper and lower surfaces of the core layer 123 in the drawing, the connection extending parts 162 may be formed on only one surface thereof or may not be formed on both surfaces thereof.

Also, the through via 160 and the connection extending part 162 may be formed in a single process. For example, the connection extending parts 162 may be signal leads. Alternatively, the connection extending parts 162 may be formed to be attached to the through via 160 after the through via 160 is formed. For example, the connection extending parts 162 may be signal pads.

Also, the protective layer 124 may be provided to cover the connection extending part 162. In this case, the protective layer 124 may include an insulator.

Figure 17:
Figure 18:

FIG. 17 illustrates a process of exposing the through via 160 by forming openings 124b and 124c in the protective layers 124, and FIG. 18 illustrates a process of attaching a conductive post 163-2.

Referring to FIG. 17, the through via 160 is exposed by the openings 124b and 124c formed in both surfaces of the frame 120. For example, the connection extending parts 162 of the through via 160 may be exposed by the openings 124b or 124c formed in both surfaces of the frame 120.

In this case, an area of the opening 124c formed in an upper surface of the frame 120 may be greater than an area of the connection extending part 162, and an area of the opening 124b formed in a lower surface of the frame 120 may be smaller than the area of the connection extending part 162. That is, side surfaces of the connection extending part 162 may be exposed by the opening 124c formed in the upper surface of the frame 120, and the side surfaces of the connection extending part 162 may not be exposed by the opening 124b formed in the lower surface of the frame 120.

Referring to FIG. 18, the conductive post 163-2 may be, for example, a solder ball. The conductive post 163-2 may have a spherical ball shape before being attached to the through via 160. However, a shape of a lower portion of the conductive post 163-2 may be modified by a pressure applied during the attaching process, and a surface contact rather than a point contact may be applied between the conductive post 163-2 and the through via 160.

Also, a cross sectional area of the lower portion of the conductive post 163-2 may be smaller than a cross sectional area of the opening 124c formed in one surface of the frame 120. That is, since the conductive post 163-2 having a relatively small area is connected to the connection extending part 162 having a relatively large area exposed by the opening 124c, an alignment process of the conductive post 163 can be facilitated and connection reliability thereof can be improved.

Referring to the drawing, the opening 124c formed in an upper portion of the through via 160 is an area in which the conductive post 163-2 is connected thereto, and the opening 124b formed in a lower portion of the through via 160 is an area in which a first wiring layer 132 to be described below is connected thereto.

Figure 19:
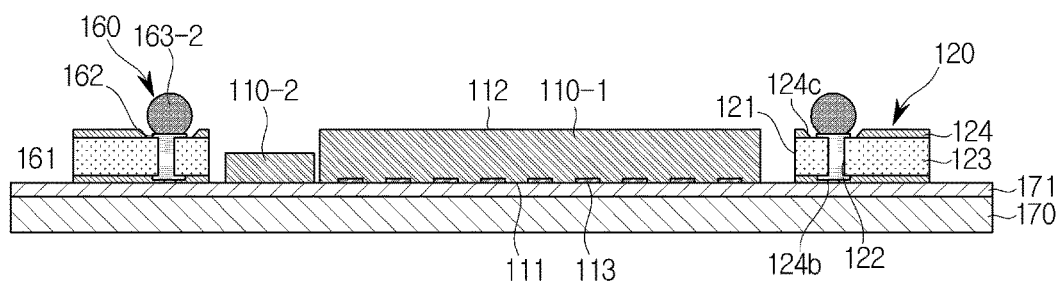
Figure 20:
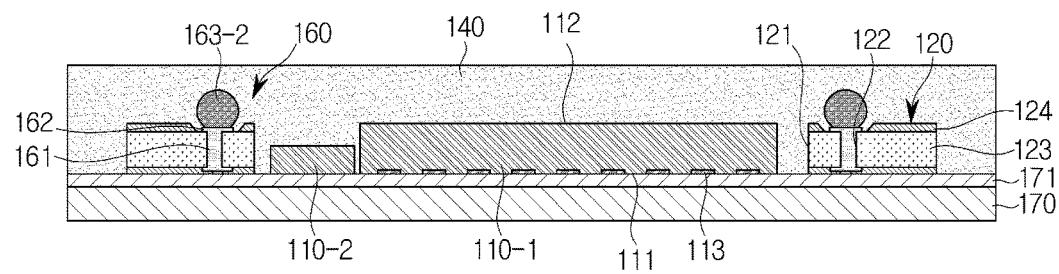
Figure 21:
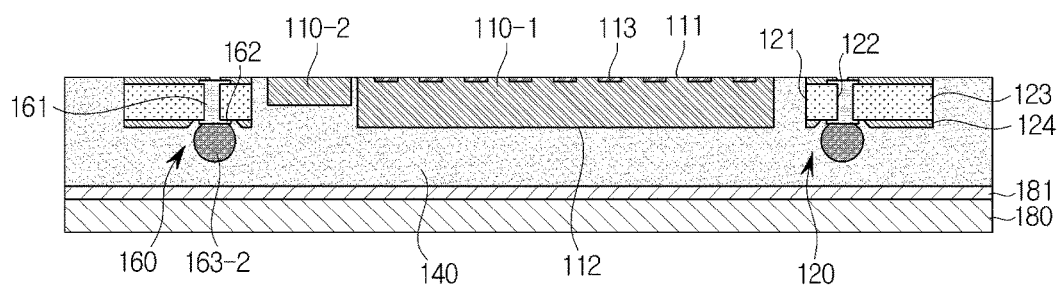
Figure 22:
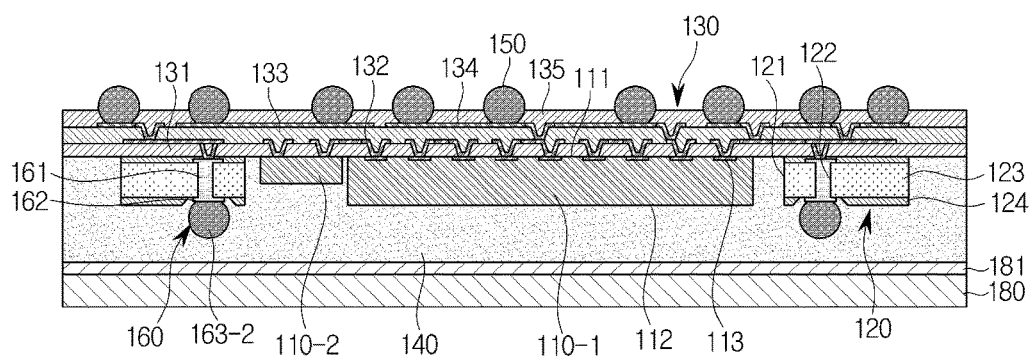
Figure 23:
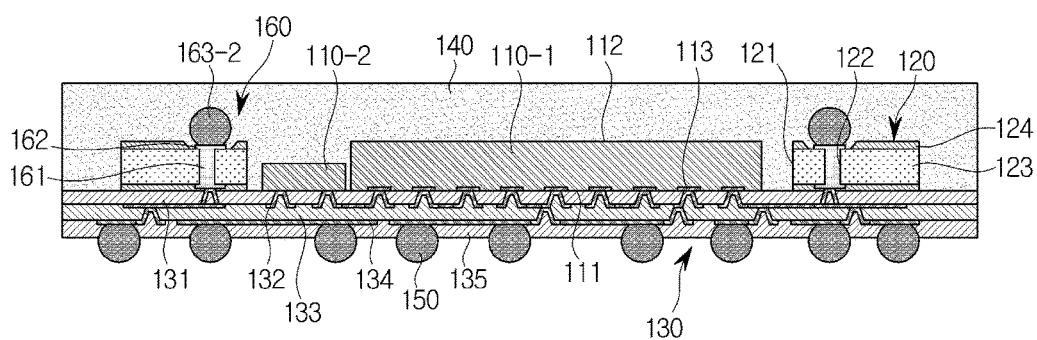

FIG. 19 illustrates an attaching process on a first carrier 170, FIG. 20 illustrates a process of molding an encapsulant 140, FIG. 21 illustrates an attaching process on a second carrier 180, FIG. 22 illustrates a process of forming a wiring part 130 and external connection terminals 150, and FIG. 23 illustrates a process of removing the second carrier 180.

Descriptions of FIGS. 19 to 23 will be replaced with those of FIGS. 5 to 9.

Figure 24:
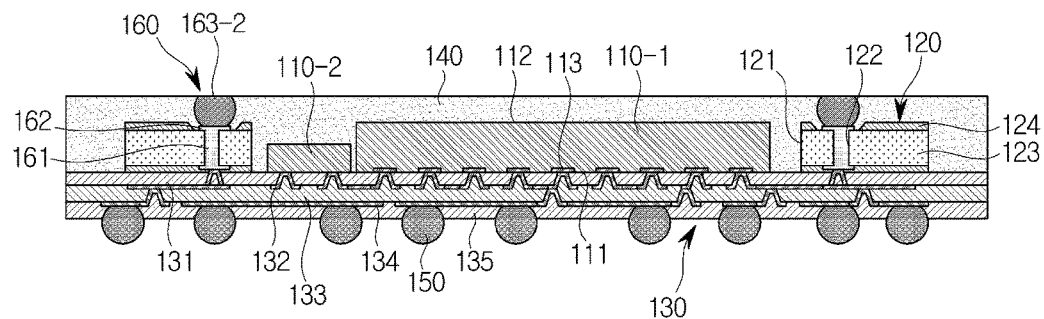
Figure 25:
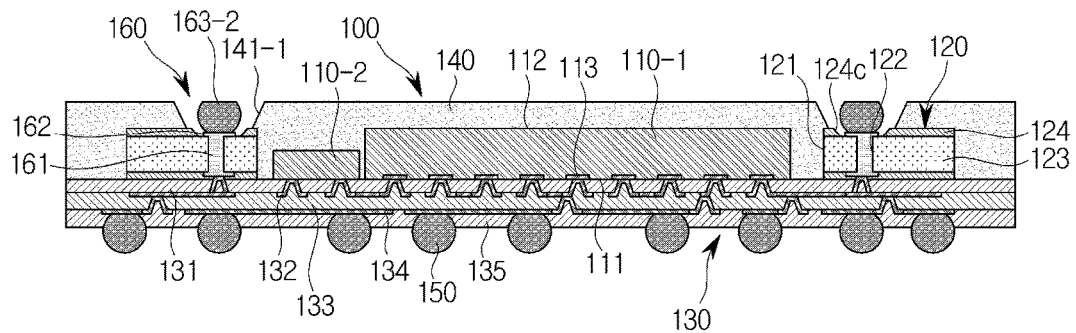

FIG. 24 illustrates a process of exposing the conductive posts 163-2 by grinding the encapsulant 140, and FIG. 25 illustrates a process of forming recessed areas 141-1 in the vicinity of the conductive posts 163-2.

Referring to FIG. 24, an end of the conductive post 163-2 may be exposed by grinding one surface of the encapsulant 140. In this case, a portion of the end of the conductive post 163-2 may also be grinded. When the conductive post 163-2 is provided to have a ball shape, an upper portion thereof may be grinded to form a flat cross section.

Referring to FIG. 25, the recessed area 141-1 may be formed by etching the vicinity of the conductive post 163-2. The recessed area 141-1 may guide an external terminal (not illustrated) connected to the conductive post 163-2 to be electrically connected to the conductive post 163-2. Further, connection areas between the conductive post 163-2 and the external terminal (not illustrated) expand, and thus alignment errors can be allowed. That is, a degree of difficulty in an alignment process can be reduced.

Meanwhile, although the recessed areas 141-1 are illustrated as being etched to expose a portion of the frame 120 in the drawing, the recessed areas 141-1 may be etched so that the frame 120 is not exposed unlike the drawing.

Figure 26:
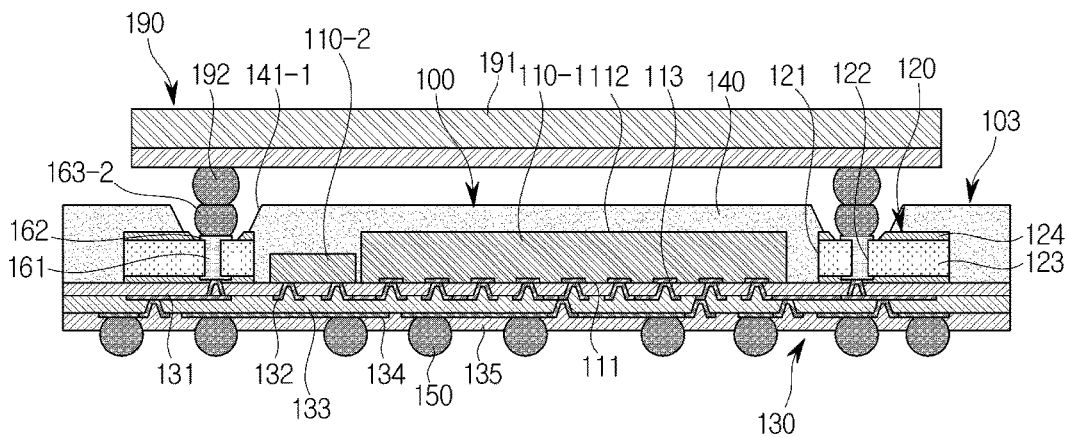
FIG. 26 is a cross-sectional view illustrating a PoP according to the second embodiment of the present invention.

FIG. 26 is a cross-sectional view illustrating a PoP according to the second embodiment of the present invention.

In the PoP according to the second embodiment of the present invention, another package 190 is stacked on and connected to the semiconductor package 103 illustrated in FIG. 25. The stacked package 190 may be a semiconductor chip, a semiconductor package, a circuit board, or the like.

The stacked package 190 may include a circuit part 191 and connection terminals 192. The connection terminals 192 are electrically connected to the circuit part 191.

The connection terminal 192 may be connected to the conductive post 163-2 of the semiconductor package 103. For example, the connection terminal 192 may be provided as a solder ball. Also, the connection terminal 192 and the conductive post 163-2 may be connected so that an end of the through via 160 is not exposed to the outside.

Figure 27:
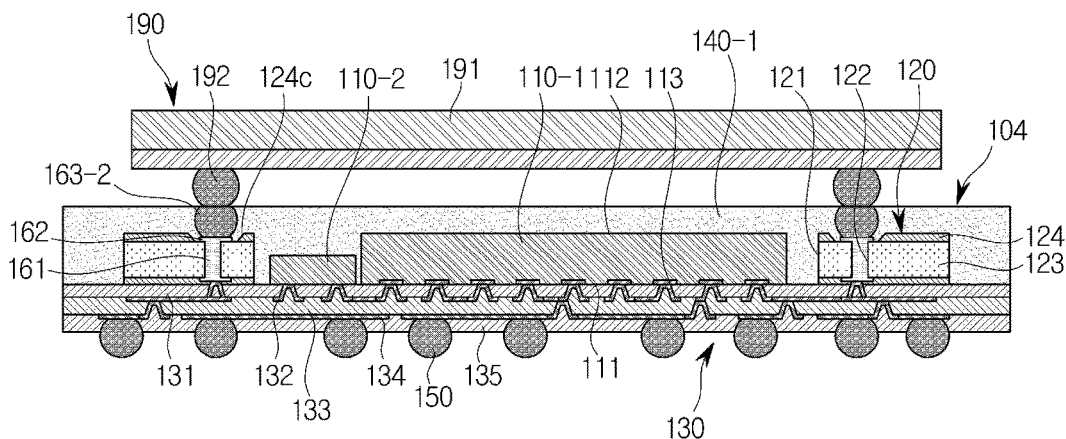
FIG. 27 is a cross-sectional view illustrating a PoP according to a modified embodiment of the second embodiment of the present invention.

FIG. 27 is a cross-sectional view illustrating a PoP according to a modified embodiment of the second embodiment of the present invention.

Referring to FIG. 27, in the PoP, another package 190 is stacked on and connected to a semiconductor package 104 according to the modified embodiment of the second embodiment of the present invention.

In the semiconductor package 104, the recessed areas 141-1 (see FIG. 26) may not be formed in the vicinity of the conductive posts 163-2. That is, as illustrated in FIG. 24, another package 190 may be stacked on and connected to the semiconductor package 104 after the end of the conductive post 163-2 is exposed by grinding one surface of the encapsulant 140-1.

Referring to FIGS. 12 and 27, when the conductive post 163-2 is provided as a solder ball compared to the case in which the conductive post 163 is provided as a copper post as illustrated in FIG. 12, an alignment range with the external connection terminal 192 may be increased. Therefore, even when the recessed area 141-1 (see FIG. 26) for guiding the alignment of the external terminals is not formed, a degree of difficulty in the process of stacking another package 190 is not increased.

In the semiconductor packages according to the embodiments of the present invention and the method of manufacturing the same, through vias passing through a frame and conductive posts provided on the through vias are used, and thus a limitation on a fine pitch can be overcome while enabling slimness of the package.

Also, a recessed area is formed, and thus the number of fine pitch errors can be reduced.

Also, when conductive posts are provided as a solder ball, it is possible to perform self-aligning and to cope with warpage.

Also, when a frame is provided with a metal, warpage of the package can be reduced, and it can be advantageous for heat dissipation and noise shielding.

Also, a process of exposing conductive posts while grinding an encapsulant is used, and thus a degree of difficulty in the process of exposing the conductive posts can be lowered.

While the present invention has been described with reference to example embodiments illustrated in accompanying drawings, these should be considered in a descriptive sense only, and it will be understood by those skilled in the art that various alterations and equivalent other embodiments may be made. Therefore, the scope of the present invention is defined by the appended claims.

What is claimed is:

1. A semiconductor package comprising:
a frame having an accommodation part and configured to transmit an electrical signal between upper and lower portions thereof through a through via provided around the accommodation part;
at least one semiconductor chip accommodated in the accommodation part;
a wiring part provided below the frame and the semiconductor chip, the wiring part being configured to connect the through via to the semiconductor chip;
an encapsulant molded to integrate the frame and the semiconductor chip, covering an inactive surface of the semiconductor chip and an upper portion of the frame, and not covering an active surface of the semiconductor chip, wherein the active surface is opposite the inactive surface; and
a conductive post connected to an upper portion of the through via,
wherein the frame is provided as a printed circuit board (PCB) having a core layer disposed at a center thereof and a protective layer stacked on an upper surface of the core layer,
wherein the through via comprises
a penetrating part with which a via-hole passing through the frame is filled; and
a connection extending part extending along the upper surface of the core layer on an upper portion of the penetrating part to an outside of the penetrating part, and
wherein the protective layer has an opening to expose the connection extending part, and the encapsulant is disposed on a side surface of the conductive post.

2. The semiconductor package of claim 1, wherein the accommodation part is formed at the center of the frame, and the via-hole is provided in a plurality and the plurality of via-holes is provided around the accommodation part, and
wherein the conductive post is connected to the connection extending part.

3. The semiconductor package of claim 2, wherein the connection extending part extends a cross-sectional area of the penetrating part in a width direction of the frame.

4. The semiconductor package of claim 1, wherein the frame is provided as a PCB in which an upper protective layer and a lower protective layer are stacked on the upper surface of the core layer and a lower surface of the core layer, respectively,
wherein the connection extending part comprises
an upper connection extending part which extends along the upper surface of the core layer; and
a lower connection extending part which extends along the lower surface of the core layer, and
wherein the upper protective layer has an opening to expose the upper connection extending part and the lower protective layer has an opening to expose the lower connection extending part.

5. The semiconductor package of claim 1, wherein the conductive post is connected to the through via in an area greater than that of the connection extending part so as to accommodate the connection extending part inside the conductive post, the connection extending part being exposed on a surface of the frame.

6. The semiconductor package of claim 1, wherein the encapsulant is formed with a recessed area to expose the outside of the conductive post, the recessed area being tapered downward.

7. The semiconductor package of claim 1, wherein the wiring part comprises
a first insulating layer stacked on the frame and a surface of the semiconductor chip so as to expose a signal pad of the semiconductor chip and a surface of the through via;
a wiring layer provided on the first insulating layer and configured to connect the signal pad of the semiconductor chip to the surface of the through via; and
a second insulating layer covering and insulating the wiring layer.

8. The semiconductor package of claim 1, wherein an upper surface of the encapsulant and an upper surface of the conductive post are coplanar.

9. The semiconductor package of claim 1, further comprising an upper wiring part stacked on an upper part of the encapsulant,
wherein the upper wiring part comprises
a first upper insulation layer stacked on a surface of the encapsulant to expose an end portion of the conductive post;
an upper wiring layer provided on the first upper insulation layer and configured to be connected to the conductive post; and
a second upper insulation layer covering and insulating the upper wiring layer.

10. The semiconductor package of claim 1, wherein the frame is provided to have a height the same as or higher than a height of the semiconductor chip.

11. The semiconductor package of claim 1, wherein the wiring part comprises
a first insulating layer stacked on the frame and a surface of the semiconductor chip so as to expose a signal pad of the semiconductor chip and a surface of the through via;
a wiring layer provided on the first insulating layer and configured to connect the signal pad of the semiconductor chip to the surface of the through via; and
a second insulation layer covering and insulating the wiring layer so as to expose an external connection terminal.

12. The semiconductor package of claim 1, further comprising an upper wiring part stacked on an upper part of the encapsulant,
wherein the upper wiring part comprises
a first upper insulation layer stacked on a surface of the encapsulant to expose an end portion of the conductive post;
an upper wiring layer provided on the first upper insulation layer and configured to be connected to the conductive post; and
a second upper insulation layer covering and insulating the upper wiring layer so as to expose an external connection terminal.

13. The semiconductor package of claim 1, wherein the active surface of the at least one semiconductor chip is coplanar with the frame.

14. The semiconductor package of claim 1, wherein the opening of the protective layer is formed in an upper surface of the protective layer, and wherein the encapsulant is disposed on the upper surface of the protective layer.

15. A semiconductor package comprising:
a frame having an accommodation part and configured to transmit an electrical signal between upper and lower portions thereof through a through via provided around the accommodation part;
at least one semiconductor chip accommodated in the accommodation part;
a wiring part provided below the frame and the semiconductor chip, the wiring part being configured to connect the through via to the semiconductor chip;
an encapsulant molded to integrate the frame and the semiconductor chip, covering an inactive surface of the semiconductor chip and upper portion of the frame, and not covering an active surface of the semiconductor chip, wherein the active surface is opposite the inactive surface; and
a conductive ball connected to an upper portion of the through via,
wherein the frame is provided as a printed circuit board (PCB) having a core layer disposed at a center thereof and a protective layer stacked on an upper surface of the core layer,
wherein the through via comprises
a penetrating part with which a via-hole passing through the frame is filled; and
a connection extending part extending along the upper surface of the core layer on an upper portion of the penetrating part to an outside of the penetrating part, and
wherein the protective layer has an opening to expose the connection extending part, and the encapsulant is disposed on a side surface of the conductive ball and is formed on the protective layer.

16. The semiconductor package of claim 15, wherein the accommodation part is formed at the center of the frame, and the via-hole is provided in a plurality and the plurality of via-holes is provided around the accommodation part, and
wherein the conductive ball is connected to the connection extending part.

17. The semiconductor package of claim 16, wherein the connection extending part extends a cross-sectional area of the penetrating part in a width direction of the frame.

18. The semiconductor package of claim 15, wherein the frame is provided as a PCB in which an upper protective layer and a lower protective layer are stacked on the upper surface of the core layer and a lower surface of the core layer, respectively,
wherein the connection extending part comprises
an upper connection extending part which extends along the upper surface of the core layer; and
a lower connection extending part which extends along the lower surface of the core layer, and
wherein the upper protective layer has an opening to expose the upper connection extending part and the lower protective layer has an opening to expose the lower connection extending part.

19. The semiconductor package of claim 15, wherein the opening is provided in an area greater than that of the connection extending part so as to accommodate the connection extending part inside the conductive ball, the connection extending part being exposed on a surface of the frame.

20. The semiconductor package of claim 15, wherein the encapsulant is formed with a recessed area to expose the outside of the conductive ball, the recessed area being tapered downward.

21. The semiconductor package of claim 15, wherein the wiring part comprises
a first insulating layer stacked on the frame and a surface of the semiconductor chip so as to expose a signal pad of the semiconductor chip and a surface of the through via;
a wiring layer provided on the first insulating layer and configured to connect the signal pad of the semiconductor chip to the surface of the through via; and
a second insulating layer covering and insulating the wiring layer.

22. The semiconductor package of claim 15, wherein the conductive ball has a flat upper surface, and an upper surface of the encapsulant and an upper surface of the conductive ball are coplanar.

* * * * *